(12) United States Patent
Graf et al.

(10) Patent No.: US 6,886,825 B2
(45) Date of Patent: May 3, 2005

(54) PLATE HANDLING SYSTEM

(75) Inventors: Michael Graf, Lenzburg (CH); Peter Berner, Rupperswil (CH)

(73) Assignees: Ursula Lüscher, Meisterschwanden (CH); Hans Lüscher, Lenzburg (CH)

( * ) Notice: Subject to any disclaimer, the term of this patent is extended or adjusted under 35 U.S.C. 154(b) by 194 days.

(21) Appl. No.: 10/367,695

(22) Filed: Feb. 19, 2003

(65) Prior Publication Data

US 2003/0156924 A1 Aug. 21, 2003

Related U.S. Application Data

(63) Continuation-in-part of application No. PCT/CH02/00124, filed on Feb. 28, 2002.

(30) Foreign Application Priority Data

Feb. 16, 2002 (EP) .............................................. 02003614

(51) Int. Cl.⁷ .............................. B65H 5/00; B65H 5/22
(52) U.S. Cl. .......................................... 271/4.01; 271/5
(58) Field of Search ......................... 271/5, 4.01, 10.01

(56) References Cited

U.S. PATENT DOCUMENTS 5,558,320 A    9/1996  Menard et al.
5,722,651 A *  3/1998  Pankhania .................. 271/3.19
5,938,187 A *  8/1999  Conlan et al. ............. 271/3.14
6,042,101 A    3/2000  Menard et al.
6,084,602 A    7/2000  Rombult et al.
2002/0185804 A1 * 12/2002 Wood et al. ............. 271/10.01
2003/0141656 A1 *  7/2003 Pankhania ................... 271/264

FOREIGN PATENT DOCUMENTS

JP          8-337329   * 12/1996  ............ B65H/3/08
WO       WO 01 08404 A    2/2001

* cited by examiner

Primary Examiner—Donald P. Walsh
Assistant Examiner—Kenneth W Bower
(74) Attorney, Agent, or Firm—Venable LLP; Stuart I. Smith; Chad C. Anderson

(57) ABSTRACT

In order cost effectively and in spite of the lowest possible expenditure on construction to permit the logical provision of printing plates of different types and sizes for an extremely wide range of printing plate exposers, in an apparatus for loading and/or unloading an exposer, in particular a drum exposer, with printing plates, having a suction means comprising at least one sucker plate and at least two suction heads connected to a vacuum system for picking up printing plates, in particular thermal printing plates, and a pivoting device for pivoting the suction means, it is proposed that the sucker plate be constructed in the form of a cylindrical segment and the suction means be pivotable about an axle which is arranged substantially parallel to the axis of the cylindrical segment.

38 Claims, 6 Drawing Sheets

PLATE HANDLING SYSTEM

RELATED DOCUMENTS

Figure 1:
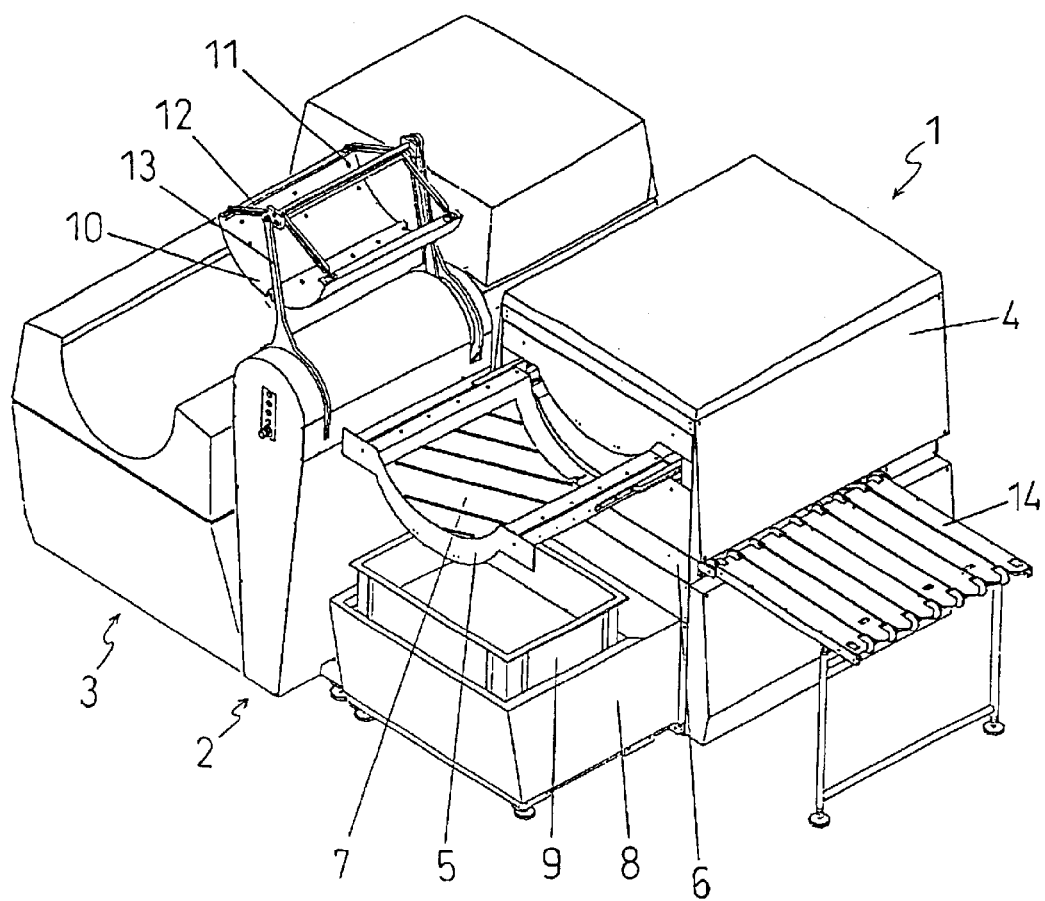

This patent application is a continuation-in-part application of the international patent application PCT/CH02/00124 file date Feb. 28, 2002 which international patent application includes the designation of the USA and which international patent application is incorporated by reference, hereby.

FIELD OF THE INVENTION

The invention relates to an apparatus for loading and/or unloading an exposer (output scanner, output recorder), in particular a drum exposer, with printing plates, comprising a suction means and a pivoting device for pivoting the suction means. The invention also relates to a printing system and process based on this apparatus.

TECHNICAL BACKGROUND

Books, newspapers, brochures or other products to be printed are produced by means of different printing processes. The production of such printed products can be carried out, firstly, by conventional printing processes, such as planographic, relief, gravure or screen printing and, secondly, by digital processes, such as the computer-to-plate (CTP) technique. In the case of offset printing, the printed products are produced by using printing forms. In this case, the image or the text to be printed is transferred to printing form blanks—also called printing plates. In this case, a light-sensitive layer applied to a metal or plastic plate, based on silver or made of a photopolymer, is exposed by means of UV radiation. In addition, in particular in the area of the CTP technique, thermal plates are also used, on which an image can be set by the action of specific temperatures. Lasers are suitable both for exposing photosensitive plates and for setting images thermally. The size of the printing plate to be produced depends on the object to be printed. For all the processes in printing technology, an extremely wide range of plate formats belong to the prior art. In the area of the CTP technique, a series of systems for setting images on printing plates with an extremely wide range of formats have been known for a long time, such as the Laserstepper from Misomex, the Laserstar from Krause or Xpose! from the Lüscher company.

In printing technology, time is a key component. Automation of the production of printing plates is therefore a logical consequence. This is because fully automatic printing plate production as one operation in the entire printing process accelerates the throughput and increases the productivity of a print shop.

DE-A 40 38 544 describes an apparatus for producing printing plates. In this case, the plate blanks are arranged in stacks on stack carriers inside a magazine. This magazine contains a circulating conveyor constructed as a paternoster and driven, having a plurality of stack carriers arranged one behind another. The stack carriers can be removed from the magazine in the horizontal direction by means of a displacement device and can be conveyed onto the copying table by a holding or feeding apparatus. This feeding apparatus comprises a suction frame with suckers. The suction frame can be moved in the horizontal and vertical plane and, can transfer a plate blank to a copying table. The disadvantage with this apparatus is, in particular, the complicated elevator mechanism within the magazine.

The apparatus described in DE-C1 41 05 269 for loading and unloading printing plates is less complicated than the apparatus described previously. Here, the plate blanks, likewise mounted in cassettes, are stacked in the manner of a tower as a magazine. The individual plate blanks can be transferred from a desired cassette to the copying table by means of a feeding apparatus. For this purpose, the cassettes can be moved in the horizontal plane out of the magazine, so that the feeding apparatus can have access to the individual plate blanks. Not every cassette can be moved individually out of the tower; instead in each case the part of the tower is moved out, so that the desired cassette with the printing plates is arranged at the top. The feeding apparatus in turn comprises a rotary star, to whose projecting pivoting arms suction heads are fixed.

The disadvantage with the apparatuses described in DE-A 40 38 544 and DE-C 41 05 269 is that they are not capable of loading cylindrical drum exposers.

EP-A 0822 453 describes an apparatus and a method for picking up and transporting printing plates into an automated exposure device. A large number of printing plates is stored in the form of stacks in cassettes or magazines. Here, different magazines can contain different plate formats. The plate removal described in the application is carried out by a feeding apparatus. For this purpose, the desired plate formats are arranged by means of a complex elevator mechanism such that they can be reached by the feeding apparatus. The feeding apparatus comprises a horizontally arranged and horizontally displaceable plate with suction heads, by means of which heads the plate on which an image is to be set can be picked up by vacuum. The disadvantage with this apparatus is, in particular, the complicated elevator mechanism. In addition, this application does not provide any solution as to how the planar printing plate can ultimately be put into the cylindrical drum exposure by the feeding apparatus, on which it is arranged by means of vacuum, as described.

An apparatus for loading drum exposers is disclosed by EP-A 0887 181. In this case, a printing plate which is arranged in a planar fashion by means of vacuum on a feeding apparatus is inserted into a cylindrical drum exposer with the aid of a loading device. The printing plate is transferred from the feeding apparatus to the loading device via rotating rolls. The loading apparatus in turn moves over rails along the inner surface of the drum exposer, carrying the printing plate with it. The same loading device can move in the opposite direction and, as a result, can transfer a printing plate on which an image has already been set out of the drum exposer to a developing machine arranged downstream. The disadvantage with this device is its complexity. Firstly, there must be a roll system to remove the printing plate from the feeding apparatus and, secondly, specific rail systems have to be arranged on a drum exposer so that the loading device can move along the internal drum. In addition, this apparatus is suitable only for loading internal drum exposers.

The prior art likewise includes apparatuses for printing plate loading and unloading which can be obtained on the market, such as the plate loading system (PHS) relating to the "Xpose!" CTP exposer from the Lüscher company. In this apparatus, the printing plates are stored in a planar fashion and in stacks in cassettes. These cassettes are arranged on one another and can be moved out of the front side in the horizontal direction. The feeding apparatus comprises a cylinder and a device for positioning the cylinder. The cylinder is mounted on the positioning device such that it can be rotated with respect to its longitudinal axis. Arranged on the cylinder are suction heads which are connected to a vacuum system. By means of the positioning device, the cylinder can be moved both in the vertical and in the horizontal direction. In order to pick up a printing plate, a cassette is pushed horizontally out of the cassette stack and the cylinder is lowered vertically onto the printing plate until the suction heads make contact with the printing plate. The cylinder is rotated over the printing plate by means of a horizontal movement of the positioning device with the vacuum switched on, as a result of which the topmost printing plate of a cassette is firmly held on the outside of the cylinder as the cylinder rotates. By means of the vertical drive of the positioning device, the cylinder is drawn upward, together with the printing plate. The cylinder with the printing plate which has been picked up is then moved over the drum of the exposer by means of a horizontal displacement by the positioning device. Using the vertical drive of the positioning device, the cylinder with the printing plate is positioned on the inside of the drum, and the printing plate is inserted into the drum by switching off the vacuum. In order to remove the printing plate on which an image has been set, the same sequence of movements is carried out in the opposite order, with the difference that the printing plate is not put back again into the cassette from which it was removed but is placed in or on a carrier, which can be arranged instead of a cassette. This carrier is then connected to a developing device. The apparatus described is also capable of removing intermediate papers, which are located between the individual printing plates in order to protect the side on which an image is to be set, by means of the same mechanism described above. This can be done, for example, while a printing plate is having an image set on it. The disadvantage with this apparatus is its complexity. Firstly, a cylinder that can be rotated about its axis and has suction heads is needed. Secondly, a device which can be moved both in the vertical and in the horizontal direction is needed to position the cylinder. In addition, the size of the apparatus is disadvantageous.

SUMMARY OF THE INVENTION

The object of the present invention is, therefore, to provide an apparatus which, cost effectively and in spite of the lowest possible expenditure on construction, permits the logical provisioning of printing plates of different types and sizes for an extremely wide range of types of printing plate exposers. In particular, this apparatus is intended likewise to be suitable for loading and unloading drum exposers. Additionally, the apparatus is to be cost-effective and space-saving.

A further object of the present invention is to provide a printing system and a method with which exposers, in particular drum exposers, can be loaded efficiently with printing plates and unloaded.

The object is achieved by an apparatus for loading and/or unloading an exposer, in particular a drum exposer, having printing plates with a suction means, comprising at least one sucker plate and at least two suction heads connected to a vacuum system, for picking up printing plates, in particular thermal printing plates, a pivoting device for pivoting the suction means, wherein the sucker plate is constructed in the form of a cylindrical segment and the suction means can be pivoted about an axis which is arranged substantially parallel to the axis of the cylindrical segment.

These measures advantageously permit the simplified and therefore cost-effective production and use of the apparatus according to the invention. In addition, these measures permit a space-saving design of the apparatus.

A very simplified pick-up device is possible on account of the suction means according to the invention, the suction means comprising a sucker plate and suction heads. In this connection, a plate is to be understood not to mean a flat, planar surface, but rather the plate has the shape of a cylindrical segment. On account of this shape, it is possible to discharge a printing plate which has been picked up to a cylindrical drum exposer, without a loading device additionally having to be arranged. According to the invention, the suction means can be pivoted about an axle which is arranged substantially parallel to the axis of the cylindrical segment. The suction means substantially maintains its axial alignment when pivoted. In this case, the sucker plate is aligned axially by the force of gravity.

A further developed embodiment of the invention provides for the use of a sucker plate which is designed such that it can be deformed in relation to its surface form. In this case, the sucker plate can be fixed by webs to an upper axle of the apparatus, it being possible for the angle or the distance between the webs to be varied.

According to one aspect of the invention, the sucker plate can be deformed by means of spindles with a spindle drive, and the webs can be constructed as pneumatic cylinders. In a development of the invention, the sides of the sucker plate, which are arranged parallel to the axis of the cylindrical segment, can be deformed more easily with respect to the surface form than the center of the sucker plate.

By means of the pivoting movement, the pick-up apparatus can reach different heights. In the case of an apparatus having a plate magazine, therefore, it is possible to dispense with a complicated elevator mechanism which brings the cassettes or printing plates into a position accessible to the pick-up apparatus. In this case, simple drawer systems can be used, in which the printing plates are stacked. The pick-up device is constructed in such a way that, by means of the arcuate pivoting movement of the suction means, all the drawers of a plate magazine can be reached. Use is preferably made of such drawers which permit the printing plates to be stored without the influence of light.

In an advantageous refinement of the invention, the base plate or an insert at the bottom of a drawer is curved convexly. A printing plate stack which is stored in a drawer consequently likewise has such a curvature. In this case, the radius of the curvature is matched approximately to the radius of the sucker plate. This measure makes possible the use of a large number of different printing plate formats.

A further advantageous measure can consist in both the opening and closing of the drawers of the plate magazine, and the movement of the suction means, being able to take place fully automatically and under software control.

According to another aspect of the invention, two pickup apparatuses according to the invention can load a drum exposer, it being possible for one apparatus to be used for the removal of the printing plate from the plate magazine and the subsequent transfer of the printing plate into an exposer and for the removal of an intermediate paper, and the other apparatus can be used for the removal of the printing plate on which an image has been set from the exposer and the transfer of said printing plate to a developing apparatus.

The apparatus according to the invention can in principle be used irrespective of the type of plate magazine, the printing plate format and the type of the exposing device. It can be used for any of the printing processes described at the start.

Further advantageous details of the invention are presented in the dependent claims, of which individual claims in turn have their own inventive contribution beyond the basic invention described here.

BRIEF INTRODUCTION OF THE DRAWINGS

Figure 2:
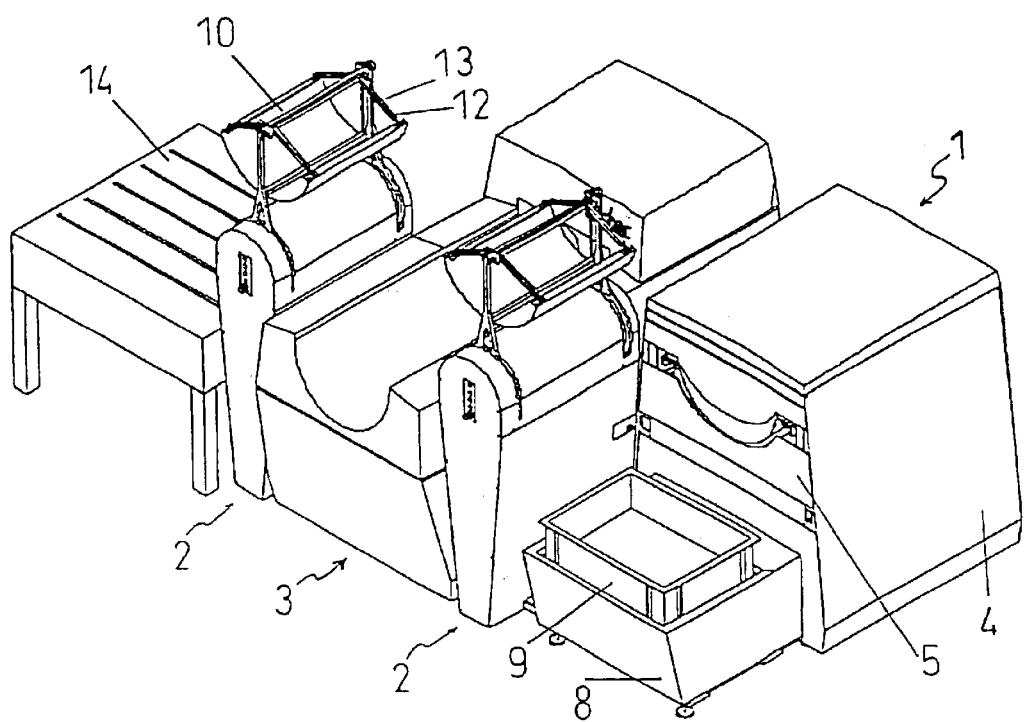
Figure 3:
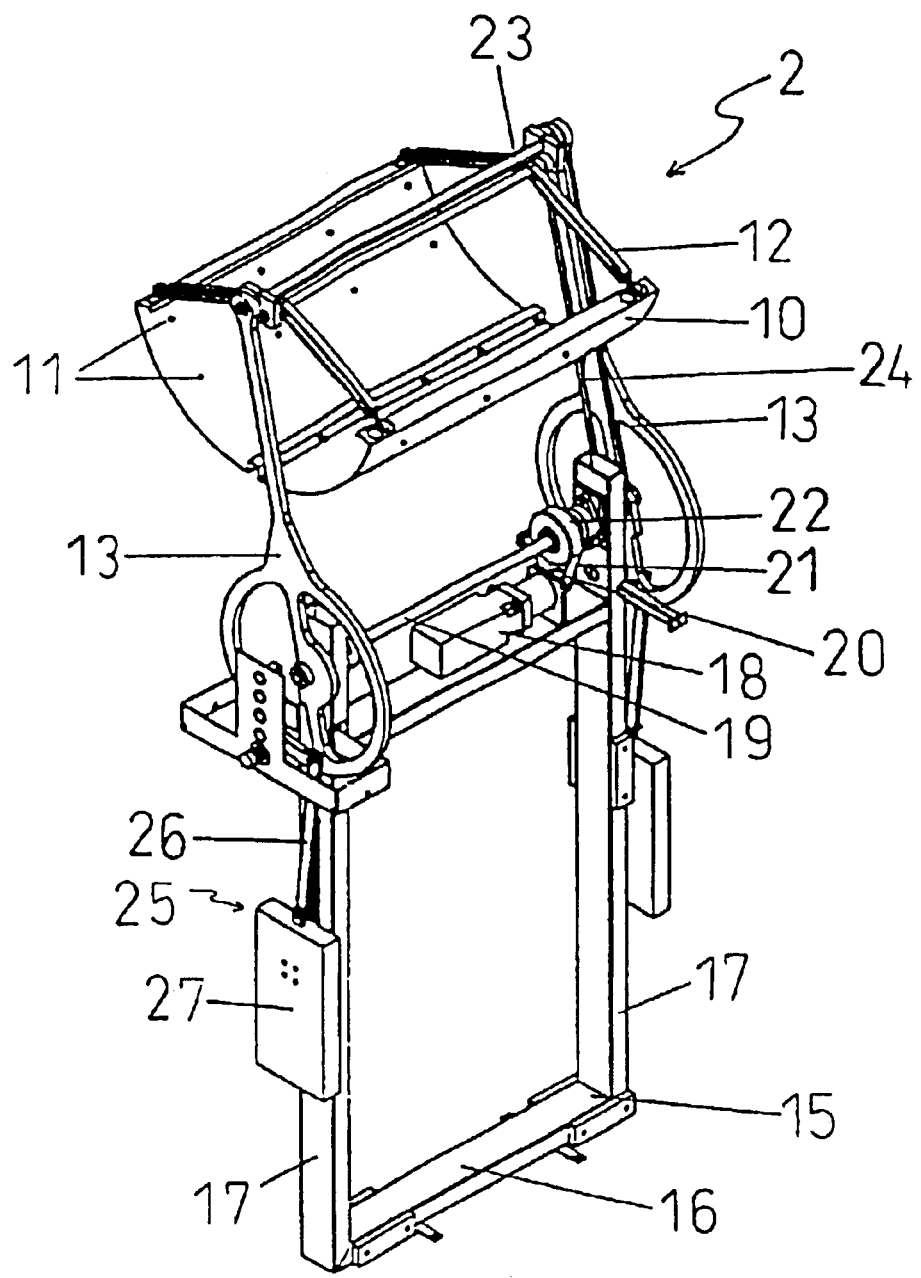
Figure 4:
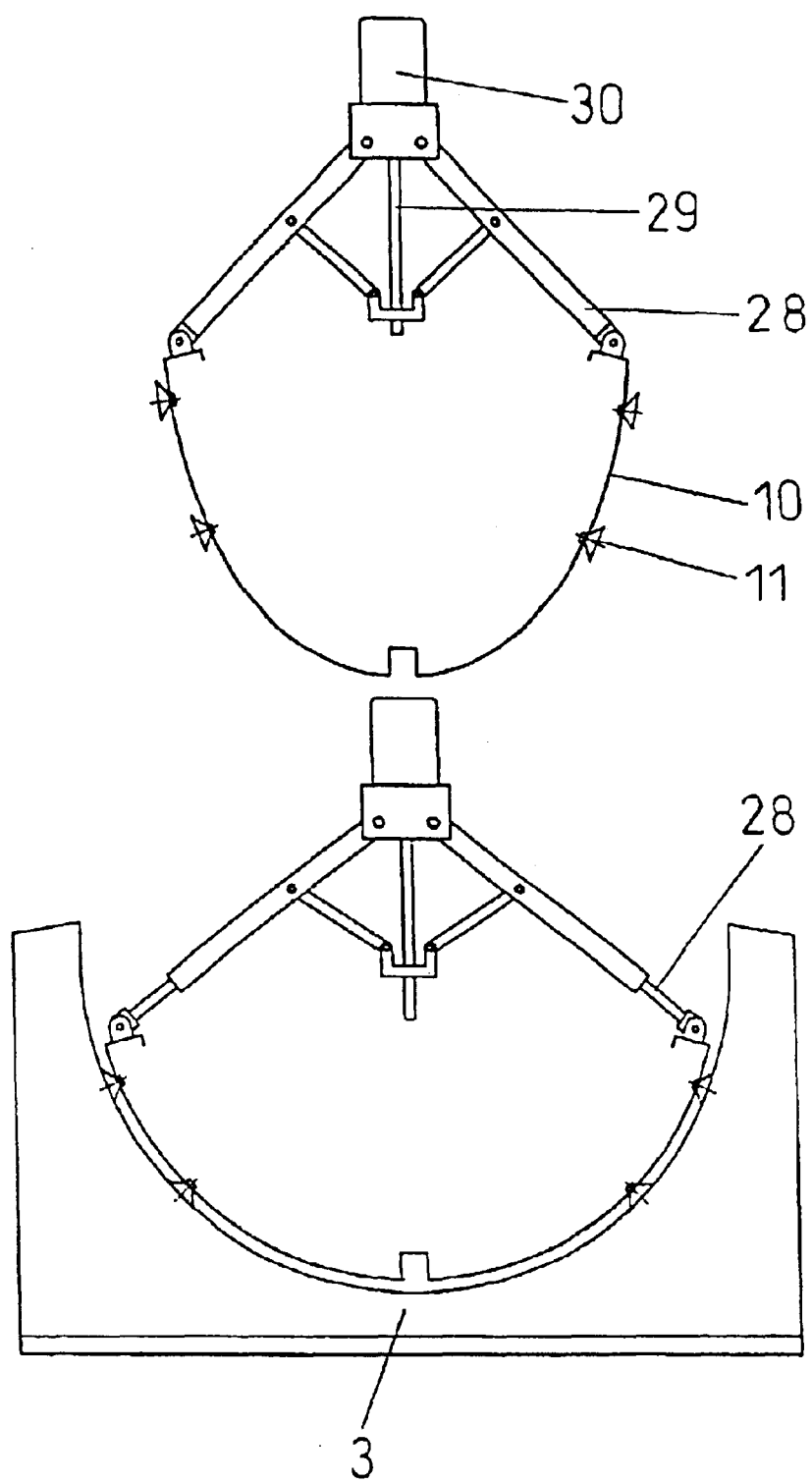
Figure 5:
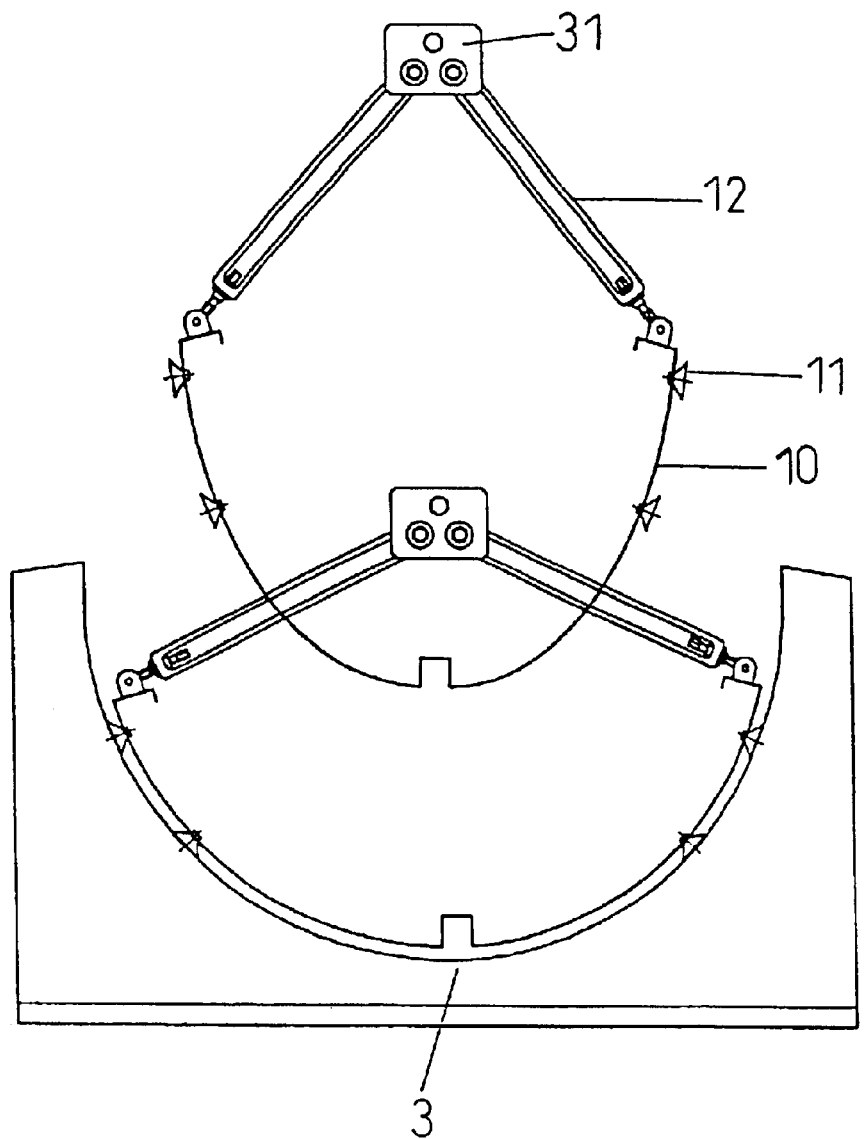
Figure 6:
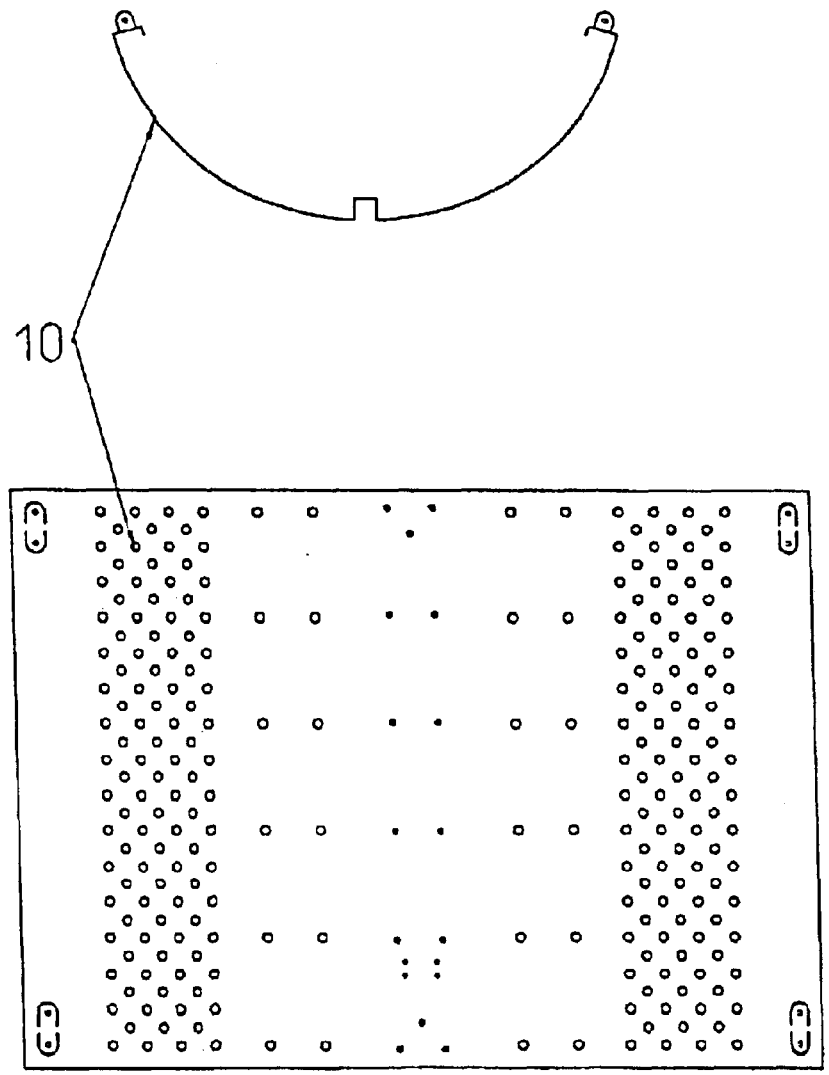

The invention will be explained in more detail using the exemplary embodiments illustrated schematically in the figures, in which:

FIG. 1 shows a schematic illustration of the apparatus according to the invention, FIG. 2 shows a schematic illustration of an apparatus having two pick-up apparatuses according to the invention, FIG. 3 shows a perspective illustration of a pick-up apparatus according to the invention, FIG. 4 shows a cross section through a schematically illustrated, deformable sucker plate according to the present invention, FIG. 5 shows a cross section of a schematically illustrated, further embodiment of a deformable sucker plate according to the present invention and FIG. 6 shows a plan view of a deformable sucker plate according to the present invention.

DETAILED DESCRIPTION OF THE PREFERRED EMBODIMENTS

FIG. 1 shows a schematic illustration of the apparatus according to the invention. The apparatus comprises a plate magazine 1, a pick-up apparatus 2 and an exposer 3. The pick-up apparatus 2 according to the invention is depicted without covering and in detail in FIG. 3.

The plate magazine 1 comprises a housing 4 having a plurality of drawers 5, 6. The bottom plate of a drawer 5 is of convexly curved design. Printing plates 7, illustrated hatched here, of an extremely wide range of types and of different formats can be placed in the manner of a stack in a drawer 5. The use of plate magazines in which the printing plates are stored in planar fashion is likewise possible. In the present embodiment, the drawers 5 are equipped with plate stacks, including the intermediate papers located as a protection between the individual plates. In each case one plate format is stored in a drawer 5, the side of the printing plate 7 on which an image is to be set being oriented upward. Up to 100 plates can be stacked per drawer 5. In the process, the printing plates 7 match the curvature of the drawer 5. The drawers 5 can be arranged to be extended by an electric motor. A detection device, not illustrated here, such as an optical sensor, for example, which is arranged in or on a drawer can detect the lack of one or more printing plates 7 in a drawer 5.

On the front side of the plate magazine 1 there is a trough 8 having a stack holder 9 to hold the intermediate papers removed from the plate stack.

The pick-up apparatus 2 comprises a sucker plate 10 with suction heads 11, which are fitted to arms 13 via webs 12. By means of the pivoting movement of the arms 13, a printing plate 7 can be removed from the drawer 5 and inserted into a drum exposer 3. For the purpose of removal, the sucker plate 10 is lowered onto the printing plate 7 until the suction heads 11 of the sucker plate 10 can make contact with the printing plate 7. The printing plate 7 can be held firmly on the sucker plate 10 by vacuum. In this case, picking up a specific plate type can be controlled by applying the vacuum selectively to specific suction heads 11.

Contact with the suction heads 11 is made with that side of the printing plate 7 on which an image is to be set. The suction heads 11 are put in place in such a way that their lateral movement on the printing plate surface is kept as small as possible. The suction heads 11 are therefore designed in such a way that injury to or destruction of this side is not possible. For example, the suction heads 11 are fabricated from resilient, soft plastic material.

As FIG. 4 illustrates, in one embodiment of the apparatus the surface form of the sucker plate 10 can be changed. The shape change of the sucker plate 10 has the effect that suction heads 11 which are arranged closer to the sides of the sucker plate 10 can make contact with the printing plate 7.

A printing plate 7, once picked up, is inserted into the semicircular drum exposer 3 by means of a pivoting movement of the arms 13. Depending on the embodiment of the apparatus, the form of the sucker plates 10 with the printing plate 7 fixed to it can be matched to the size of the opening in the exposer 3. Exact positioning of the printing plate 7 in the exposer 3, not illustrated here, can be carried out either via a punched-out portion of the printing plate 7, which can be inserted in exact register in pins arranged on the exposer 3, or the position of the printing plate 7 can be registered digitally.

While the laser of the exposer 3 is setting an image on the printing plate 7, the pick-up apparatus 2 is able to remove an intermediate paper which is located between the individual plates 7 for the purpose of protecting stacked printing plates 7. After a printing plate 7 has been removed from a plate stack, such an intermediate paper is at the top in a drawer 5. The removal of this sheet is done with the same mechanism as the picking up of a printing plate 7, that is to say via the sucker plate 10 and the vacuum system which can be applied. In order that an intermediate paper is not picked up together with a printing plate, different sizes of suction heads 11 are arranged on the sucker plate 10. An intermediate paper is in this case picked up by means of a vacuum system which is applied to smaller suction heads. Once the intermediate paper has been picked up, the drawer 5 moves back into the plate magazine 1. As a result of canceling the vacuum, the sheet falls into the stack container 9 in front of the plate magazine 1.

The presence or absence of a printing plate 7 or of an intermediate paper can be established by a sensor mechanism which is not illustrated here but which can be arranged on the sucker plate 10. For example, an inductive detector can report whether metal or nonmetal is resting on the sucker plate 10.

After an image has been set on the printing plate 7 and the intermediate paper has been removed, the printing plate 7 is transferred onto the conveyor belts of the planar drawer 6 by means of the pick-up apparatus 2. Via the conveyor belts, not illustrated here, of the drawer 6, the plate is output to the output ramp 14 and can subsequently be fed to a developing device, not illustrated here. The output ramp 14 can also be arranged at the rear of the plate magazine.

Both the construction of the exposer 3 and that of the developing device are known per se and therefore do not require any specific explanation in the present connection.

For the further time optimization of the printing plate production, two of the pick-up apparatuses 2 according to the invention can be arranged on an exposer 3. A schematic illustration of such an apparatus is shown in FIG. 2. In this case, one pick-up apparatus 2 loads the drum exposer 3 with printing plates 7 and removes the intermediate papers. This pick-up apparatus is therefore arranged to a plate magazine 1. The other pick-up device 2 removes the printing plates 7 on which images have been set from the drum exposer 3 and passes these on via an output ramp 14 to a developer, not illustrated here.

The pick-up apparatus 2 is illustrated schematically in FIG. 3. It comprises a frame 15 having a bottom part 16 and two side parts 17. The side parts 17 are connected at their upper end to a rotatable, lower axle or shaft 19 driven by a motor 18. The drive shaft of the motor 18 goes onto a pinion 20. The pinion 20 is operatively connected via a first tooth belt 21 to a belt pulley 22. The belt pulley 22 is firmly seated on the shaft 19 so as to rotate with it. The latter is connected at both ends to an arm 13 in each case. Here, the end of the arms 13 arranged at the shaft 19 is of curved or disk-like design. The arms 13 are synchronized via the shaft 19 and execute parallel pivoting movements. At the other end of the arms 13, a sucker plate 10 is rotatably arranged via a mounting comprising an upper axle 23 and webs 12. The sucker plate 10 is constructed in the form of a cylindrical segment. The upper axle 23 of the sucker plate 10 is arranged substantially parallel to the shaft 19. The sucker plate 10 is arranged such that it can be pivoted about the upper axle 23. When pivoted, the sucker plate 10 maintains the axial alignment, the sucker plate 10 being aligned on the basis of the force of gravity. The upper axle 23 is operatively connected to the shaft 19 via a further toothed belt 24. As a result of the drive, the sucker plate 10 executes a controllable pivoting movement.

The sucker plate 10 comprises at least two suction heads 11. Illustrated here are a plurality of suction heads 11, which are fitted in rows in or on the sucker plate 10, parallel to the upper axle 23. It is possible for suction heads 11 of different sizes to be arranged on the sucker plate 10. Another arrangement of the suction heads 11 is likewise possible. The suction heads 11 are connected to a controllable vacuum system, not illustrated here. The sucker plate 10 is constructed such that it can be deformed in relation to its surface form. Various embodiments of the sucker plate 10 are illustrated in FIGS. 4 and 5.

The drive motor 18 is assisted by a counterweight system 25. For this purpose, a rod 26 having a weight 27 is in each case fixed to the curved end of the arms 13. The weight 27 is guided on the frame 15 SO that it can execute only vertical movements. To this end, in each case a guide carriage is arranged on the weight 27 and a guide rail on the frame 15, neither of which is shown here. When the arms 13 are lowered, the weight 27 is pulled upward by the pivoting movement, and downward when the arms 30 are lowered. The torque acting about the axles 19 therefore retards the pivoting movement during lowering, while during raising it assists the torque of the motor force.

FIGS. 4 and 5 illustrate schematically the cross sections of various embodiments of a deformable sucker plate 10 having means for fixing to the upper axle 23. The fixing means in FIG. 4 comprises two pneumatic cylinders 28 and a spindle 29 with a spindle drive 30. Shown in FIG. 5 is a means for fixing the sucker plate 10 which, in each case, comprises two webs 12 and a connecting piece 31, on which the webs 12, the upper axle 23 and the arms 13, the latter not illustrated, [lacuna].

The webs 12 or the pneumatic cylinders 28 are rotatably fitted to the sucker plate 10 and to the connecting piece 31 or to the spindle drive 30. By reducing the size of the angle between the webs 12 or the pneumatic cylinders 28, the sucker plate 10 can be deformed in relation to its surface form.

In this case, the angular change and therefore the form change of the sucker plate 10 can be controlled, as shown in FIG. 4, by a spindle drive 30. As an alternative to this, the angular change can be induced on account of the force of gravity. If the sucker plate is guided upward from the drum exposer 3 or from a drawer 5, as illustrated in FIG. 5, then the angle between the webs 12 changes on account of the force of gravity which acts on the sucker plate 10.

A further exemplary embodiment of a sucker plate 10 is shown in FIG. 6. At the sides, which are arranged parallel to the axis of the cylindrical segment, the sucker plate 10 has holes so that it can be deformed more easily in relation to its surface form at these sides than in the center.

The invention also relates to a printing system and a method for automatic printing plate loading and unloading. FIG. 1 illustrates an apparatus with which the method according to the invention may be carried out. A drawer 5 belonging to the plate magazine 1, containing a stack of printing plates 7 of a specific format, is extended horizontally by a drive. The pickup apparatus 2 is then pivoted in the direction of the plate magazine 1 to such an extent that the sucker plate 10 can make contact with the printing plate 7. In an embodiment of the invention with a deformable sucker plate 10, all the suction heads 11 make contact with the printing plate 7 as a result of the pivoting movement being continued. By applying vacuum to the suction heads 11, the printing plate 7 is held on the sucker plate 10. After a printing plate 7 has been picked up on the sucker plate 10, the latter is positioned into the drum of the exposer 3 by means of the pivoting movement of the arms 13, and is inserted into the drum as a result of the vacuum being switched off.

While the exposer 3 is setting an image on the printing plate 7, the intermediate paper is removed. For this purpose, the arms 13 pivot back from the exposer 3 toward the still-open drawer 5 of the plate magazine 1. The sucker plate 10 is then lowered onto the intermediate paper which, following the removal of the printing plate 7, is located at the top in the drawer 5. The action of picking up the sheet is carried out via the same mechanism as that of a printing plate 7. In order to prevent a printing plate being picked up together with an intermediate paper, the vacuum system is applied selectively to the smaller suction heads 11. In addition, the presence of a printing plate 7 and/or of an intermediate paper on the sucker plate 10 can be detected via a sensor mechanism.

After the intermediate paper has been picked up by the sucker plate 10, the drawer 5 is moved back into the plate magazine 1 again. As a result of the vacuum being switched off, the intermediate paper falls down, into the stack container 9 of the trough 8.

The pick-up apparatus 2 then pivots back to the drum exposer 3 again and picks up the printing plate 7 on which an image has been set, by applying the vacuum. The arms 13 pivot back again toward the open drawer 6. The drawer 6 is closed, and the printing plate 7 on which an image has been set is transferred to the output ramp 14 by the conveyor belts of the drawer 6. Finally, the printing plate 7 is fed to the developing device arranged downstream by means of the output ramp 14.

In a further embodiment of the method according to the invention, two pick-up apparatuses 2 can be used for loading and unloading an exposer 3 and for removing an intermediate paper. The first pick-up apparatus 2 removes the printing plate 7, loads the exposer 3 and removes the intermediate paper. All the method steps are carried out as described above. After an image has been set, the second pick-up apparatus 2 removes the printing plate 7 on which an image has been set and transfers it either directly to a developing device or to an interposed output ramp 14. While the second pickup apparatus 2 is removing the printing plate 7, the first pick-up apparatus 2 can already pick up a next printing plate 7 and keep it ready to load the exposer 3.

What is claimed is:

1. An apparatus for loading and/or unloading an exposer (3), in particular a drum exposer (3), having printing plates (3) with
a suction means (10, 11), comprising at least one sucker plate (10) and at least two suction heads (11) connected to a vacuum system, for picking up printing plates (7), in particular thermal printing plates,
a pivoting device for pivoting the suction means (10, 11), wherein the sucker plate (10) is constructed in the form of a cylindrical segment and
the suction means (10, 11) can be pivoted about an axis which is arranged substantially parallel to the axis of the cylindrical segment.

2. The apparatus as set forth in claim 1, wherein said suction means (10, 11) substantially maintains the axial alignment when pivoted.

3. The apparatus as set forth in claim 1, wherein said pivoting device comprises at least one arm (13) which is rotatably arranged on a shaft (19), and in that the suction means can be pivoted about an axle (23) substantially parallel to the shaft (19).

4. The apparatus as set forth in claim 3, wherein said pivoting device comprises two arms (13) for carrying out parallel pivoting movements.

5. The apparatus as set forth in claim 1, wherein said pivoting device can execute a pivoting movement of 45° to 270°, preferably of 75° to 240°.

6. The apparatus as set forth in claim 1, wherein said suction heads (11) of different sizes are arranged in or on the sucker plate (10).

7. The apparatus as set forth in claim 1, wherein said sucker plate (10) is aligned axially by the force of gravity.

8. The apparatus as set forth in claim 1, wherein said sucker plate (10) is designed such that it can be deformed, at least in relation to its surface form.

9. The apparatus as set forth in claim 8, wherein at the sides which are arranged substantially parallel to the axis of the cylindrical segment, the sucker plate (10) can be deformed more easily with respect to the surface form than in the center.

10. The apparatus as set forth in claim 1, wherein said sucker plate (10) is fixed to a suspension means.

11. The apparatus as set forth in claim 10, wherein said suspension means comprises an upper axle (23) of the apparatus, the sucker plate (10) is fixed to the upper axle via webs (12), and in that the angle or the distance between two webs (12) can be varied.

12. The apparatus as set forth in claim 11, wherein said suspension means comprises a spindle (29) having a spindle drive (30) for deforming the sucker plate (10).

13. The apparatus as set forth in claim 11, wherein at least one of the webs (12) comprises a pneumatic cylinder (28).

14. The apparatus as set forth in claim 1, wherein said suction means (10, 11) is also designed to remove an intermediate paper.

15. The apparatus as set forth in claim 1, comprising a drive means, preferably by a motor (18) assisted by a counterweight (25).

16. The apparatus as set forth in claim 1, further comprising a plate magazine (1).

17. The apparatus as set forth in claim 16, wherein said plate magazine (1) comprises extendable drawers (5, 6), in particular drawers (5) with a convexly curved bottom plate or convexly curved insert at the bottom of a drawer (5).

18. The apparatus as set forth in claim 16, wherein printing plates (7) of different format can be stacked in the drawers (5).

19. The apparatus as set forth in claim 16, wherein said drawers (5) are optically opaque when in the closed state.

20. The apparatus as set forth in claim 16, wherein one of said drawers (6) has at last one conveying means for moving a printing plate (7), in particular a conveyor belt.

21. The apparatus as set forth in claims 16, wherein said drawers (5, 6) can be extended in the horizontal plane by a drive.

22. The apparatus as set forth in claim 16, further comprising detection means for detecting the lack of at least one printing plate (7) in a drawer, the detection means being arranged in or on a drawer (5).

23. The apparatus as set forth in claim 22, wherein said detection means comprises an optical sensor.

24. A printing system comprising an apparatus as set forth in claim 16, wherein it is possible for a printing plate (7) to be removed from a drawer (5) by the suction means (10, 11), inserted into an exposer (3), in particular a drum exposer (3), by carrying out a pivoting movement of the arms (13), and/or transferred to an output ramp (14), and/or for an intermediate paper to be removed.

25. A printing system as set forth in claim 24, comprising a control system for the opening of the drawers (5, 6), a transfer of the printing plate (7) from the plate magazine (1) to the exposer (3), from the exposer (3) to the output ramp (14) and/or the removal of an intermediate paper to be automated.

26. A printing system comprising an apparatus as set forth in claim 1, wherein it is possible for a printing plate (7) to be picked up by the suction means (10, 11), inserted into an exposer (3), in particular a drum exposer (3), by carrying out a pivoting movement of the arms (13), and/or transferred to an output ramp (14), and/or for an intermediate paper to be removed.

27. A printing system as set forth in claim 26, comprising a first apparatus for loading an exposer (3) and/or for removing an intermediate paper, and a second apparatus for unloading an exposer (3).

28. A method of loading and/or unloading an exposer (3), in particular a drum exposer (3), with printing plates (7) by means of an apparatus which comprises a suction means (10, 11) comprising at least one sucker plate (10) and at least two suction heads (11) connected to a vacuum system to pick up printing plates (7), in particular thermal printing plates (7), having one or more of the steps in which
a printing plate (10) is picked up by the suction means (10, 11),
is inserted into an exposer (3),
is removed from the exposer (3) and
is transferred to an output ramp (14), and
an intermediate paper is removed
wherein
the sucker plate (10) is constructed in the form of a cylindrical segment,
the suction means (10, 11) is fixed to arms and
the suction means (10, 11) is moved by means of a pivoting movement of the arms (13).

29. The method as set forth in claim 28, wherein said sucker plate (10) substantially maintains the axial alignment when pivoted, the sucker plate (10) being aligned axially by the force of gravity.

30. The method as set forth in claim 28, wherein said sucker plate (10) is pivoted by means of a pivoting device about an axle substantially parallel to the axis of the cylindrical segment.

31. The method as set forth in claim 28, wherein said sucker plate (10) is deformed at least in relation to its surface form.

32. The method as set forth in claim 28, wherein said printing plates (7) are picked up from a drawer of a plate magazine (1).

33. The method as set forth in claim 32, wherein said printing plate can be picked up from extendable drawers (5, 6), in particular drawers (5) with a convexly curved bottom plate or a convexly curved insert at their bottom.

34. The method as set forth in claim 32, wherein printing plates (7) of different format are stacked in the drawers (5).

35. The method as set forth in claim 32, characterized in that using a detection means to detect the lack of at least one printing plate (7) in a drawer (5), the lack of at least one printing plate (7) is detected, the detection means being arranged in or on a drawer (5).

36. The method as set forth in claim 28, wherein by means of a control system, both the opening of the drawers (5, 6), the transfer of the printing plate (7) from the plate magazine (1) to the exposer (3) and/or from the exposer (3) to the output ramp (14), and/or the removal of an intermediate paper proceeds in an automated manner.

37. The method as set forth in claim 28, wherein said loading of the exposer (3) and/or the removal of an intermediate paper is carried out by means of a first apparatus, which comprises a suction means (10, 11) comprising at least one sucker plate (10) and at least two suction heads (11) connected to a vacuum system for picking up printing plates (7), and the unloading of the exposer is carried out by means of a second apparatus, which comprises a suction means (10, 11) comprising at least one sucker plate (10) and at least two suction heads (11) connected to a vacuum system for picking up printing plates (7), the sucker plate (10) in at least one of the aforementioned apparatuses being constructed in the form of a cylindrical segment, and the suction means (10, 11) being fixed to arms and being moved by means of a pivoting movement of the arms (13).

38. The method as set forth in claim 37, wherein said sucker plate (10) is deformed at least in relation to its surface form.

* * * * *